United States Patent
Sato et al.

(10) Patent No.: US 10,774,002 B2
(45) Date of Patent: Sep. 15, 2020

(54) METHOD FOR PRODUCING ORIENTED SINTERED BODY

(71) Applicant: NGK INSULATORS, LTD., Nagoya (JP)

(72) Inventors: Kei Sato, Tokai (JP); Takahiro Maeda, Ichinomiya (JP); Morimichi Watanabe, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 236 days.

(21) Appl. No.: 15/956,898

(22) Filed: Apr. 19, 2018

(65) Prior Publication Data

US 2018/0237343 A1 Aug. 23, 2018

Related U.S. Application Data

(63) Continuation of application No. PCT/JP2016/078264, filed on Sep. 26, 2016.

(30) Foreign Application Priority Data

Nov. 16, 2015 (JP) ................................. 2015-224164
Jul. 14, 2016 (JP) ................................. 2016-139508

(51) Int. Cl.
*C04B 35/115* (2006.01)
*C04B 35/10* (2006.01)
(Continued)

(52) U.S. Cl.
CPC ............ *C04B 35/115* (2013.01); *C01F 7/021* (2013.01); *C01F 7/023* (2013.01); *C01F 7/30* (2013.01);
(Continued)

(58) Field of Classification Search
CPC ........... C04B 35/10; C04B 35/111–115; C04B 2235/787
See application file for complete search history.

(56) References Cited

U.S. PATENT DOCUMENTS 4,996,177 A 2/1991 Takagi et al.
2008/0248277 A1 10/2008 Yokoyama et al.
(Continued)

FOREIGN PATENT DOCUMENTS

CN 1031361 A 3/1989
CN 101903542 A 12/2010
(Continued)

OTHER PUBLICATIONS

English translation of International Preliminary Report on Patentability (Chapter 1) (Application No. PCT/JP2016/078264) dated May 31, 2018, 12 pages.
(Continued)

*Primary Examiner* — Erin Snelting
(74) *Attorney, Agent, or Firm* — Burr & Brown, PLLC (57) ABSTRACT

A method for producing an oriented sintered body according to the present invention includes the steps of: (a) preparing a multilayer body, the multilayer body including a layer including a fine raw-material powder and a layer including a plate-like raw-material powder which are alternately stacked each other, particles of the plate-like raw-material powder being arranged such that surfaces of the particles of the plate-like raw-material powder extend along a surface of the layer including a fine raw-material powder; and (b) sintering the multilayer body.

8 Claims, 2 Drawing Sheets

[Multilayer body10]

(51) Int. Cl.
  *C04B 35/622* (2006.01)
  *C04B 35/645* (2006.01)
  *C01F 7/02* (2006.01)
  *C04B 35/632* (2006.01)
  *C04B 35/638* (2006.01)
  *C04B 35/634* (2006.01)
  *C30B 29/20* (2006.01)
  *C30B 28/02* (2006.01)
  *C30B 1/04* (2006.01)
  *C01F 7/30* (2006.01)
  *C30B 1/12* (2006.01)

(52) U.S. Cl.
  CPC ............ *C04B 35/10* (2013.01); *C04B 35/622* (2013.01); *C04B 35/632* (2013.01); *C04B 35/638* (2013.01); *C04B 35/6342* (2013.01); *C04B 35/645* (2013.01); *C30B 1/04* (2013.01); *C30B 1/12* (2013.01); *C30B 28/02* (2013.01); *C30B 29/20* (2013.01); *C01P 2004/20* (2013.01); *C01P 2004/54* (2013.01); *C01P 2004/61* (2013.01); *C04B 2235/3206* (2013.01); *C04B 2235/5292* (2013.01); *C04B 2235/5296* (2013.01); *C04B 2235/5436* (2013.01); *C04B 2235/5445* (2013.01); *C04B 2235/6025* (2013.01); *C04B 2235/6567* (2013.01); *C04B 2235/787* (2013.01)

(56) References Cited

U.S. PATENT DOCUMENTS

| | | | |
|---|---|---|---|
| 2008/0284286 | A1 | 11/2008 | Ogawa et al. |
| 2008/0295948 | A1* | 12/2008 | Yokoyama ............... B32B 18/00 156/89.11 |
| 2009/0170686 | A1 | 7/2009 | Yura et al. |
| 2010/0071179 | A1* | 3/2010 | Koizumi ............... C01G 23/003 29/25.35 |
| 2015/0144956 | A1 | 5/2015 | Watanabe et al. |

FOREIGN PATENT DOCUMENTS

| | | | |
|---|---|---|---|
| JP | S64-033055 | A1 | 2/1989 |
| JP | 2007-173679 | A1 | 7/2007 |
| JP | 2009-046376 | A1 | 3/2009 |
| JP | 2010-018510 | A1 | 1/2010 |
| JP | 2010-163313 | A1 | 7/2010 |
| JP | 5770905 | B1 | 8/2015 |

OTHER PUBLICATIONS

International Search Report and Written Opinion (Application No. PCT/JP2016/078264) dated Nov. 1, 2016.

Chinese Office Action (with English translation), Chinese Application No. 201680061130.3, dated Jul. 1, 2020 (12 pages).

* cited by examiner

[Multilayer body 10]

FIG. 2B

[Oriented sintered body 20]

METHOD FOR PRODUCING ORIENTED SINTERED BODY

BACKGROUND OF THE INVENTION

1. Field of the Invention

The present invention relates to a method for producing an oriented sintered body.

2. Description of the Related Art

It has been proposed that TGG (templated grain growth) can be used for producing an oriented sintered body (e.g., see PTL 1). In this method, fine raw-material particles and plate-like raw-material particles (i.e., template particles) are mixed at predetermined proportions, the plate-like raw-material particles included in a compact are arranged in a specific manner by a shearing force applied using tape casting method, such as doctor blade method, and homoepitaxial growth is performed while the fine raw-material particles are incorporated into the plate-like raw-material particles during sintering.

CITATION LIST

Patent Literature

PTL 1: Japanese Patent No. 5770905 (Paragraphs 0036 and 0037)

SUMMARY OF THE INVENTION

However, apparatuses that can be used in the above method are limited. For example, since arranging the template particles in a specific manner requires the application of considerably large shearing force during tape casting method, it is necessary to use a large tape casting machine. Specifically, the casting speed of the tape casting machine needs to be increased in order to apply a certain amount of shearing force. In such a case, in order to prevent insufficient drying, it is necessary to perform drying with a long casting machine. This increases the size of the tape casting machine. Accordingly, the development of a method for producing an oriented sintered body in an easy and simple manner compared with TGG has been anticipated.

The present invention was made in order to address the above issues. A primary object of the present invention is to produce an oriented sintered body in an easy and simple manner compared with TGG.

A method for producing an oriented sintered body according to the present invention comprising the steps of:

(a) preparing a multilayer body, the multilayer body including a layer including a fine raw-material powder and a layer including a plate-like raw-material powder which are alternately stacked each other, particles of the plate-like raw-material powder being arranged such that surfaces of the particles of the plate-like raw-material powder extend along a surface of the layer including a fine raw-material powder; and (b) sintering the multilayer body.

In the method for producing an oriented sintered body according to the present invention, a multilayer body including layers including a fine raw-material powder and layers including a plate-like raw-material powder alternately stacked one another is prepared, and the multilayer body is sintered. In the plate-like raw-material powder layers, the plate-like raw-material particles are arranged such that the surfaces of the particles extend along the surface of the fine raw-material powder layer. In TGG, tape casting of a mixed powder of a fine raw-material powder and a plate-like raw-material powder has required the application of a considerably large shearing force in order to arrange the plate-like raw-material powder in a specific manner. In contrast, in the present invention, it is not necessary to apply the large shearing force required in TGG because the plate-like raw-material powder is to be arranged instead of the mixed powder. This makes the structure of the apparatus used in the present invention compact compared with TGG. Thus, the method for producing an oriented sintered body according to the present invention is capable of producing an oriented sintered body in an easy and simple manner compared with TGG.

BRIEF DESCRIPTION OF THE DRAWINGS

FIGS. 1A and 1B include schematic diagrams illustrating a plate-like alumina particle.

FIGS. 2A and 2B include diagrams illustrating a process for producing an oriented sintered body 20.

DETAILED DESCRIPTION OF THE INVENTION

A method for producing an oriented sintered body according to the present invention comprising the steps of:

(a) preparing a multilayer body, the multilayer body including a layer including a fine raw-material powder and a layer including a plate-like raw-material powder which are alternately stacked each other, particles of the plate-like raw-material powder being arranged such that surfaces of the particles of the plate-like raw-material powder extend along a surface of the layer including a fine raw-material powder; and (b) sintering the multilayer body.

The fine raw-material powder layer used in Step (a) is a layer including an assembly of fine raw-material particles. The fine raw-material powder is a powder having a smaller average particle diameter than the plate-like raw-material powder. The fine raw-material powder layer may be a layer including the fine raw-material powder or may be a layer including a mixture of the fine raw-material powder with an additive. Examples of the additive include a sintering aid, graphite, a binder, a plasticizer, a dispersant, and a disperse medium. Examples of the method for forming the above layer include, but are not limited to, tape casting method, extrusion casting method, slip casting method, injection casting method, and uniaxial press forming method. The thickness of the fine raw-material powder layer is preferably 5 to 100 μm, is more preferably 10 to 100 μm, and is further preferably 20 to 60 μm.

Figure 1A:
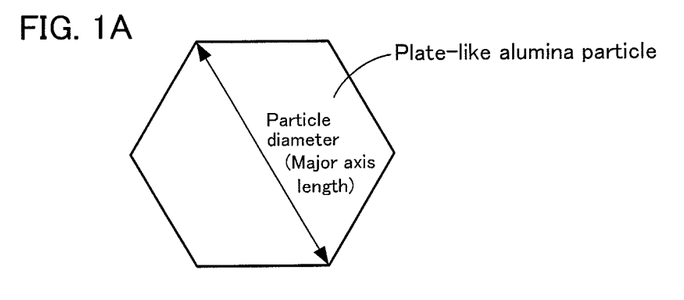
FIG. 1A is a plan view.
Figure 1B:
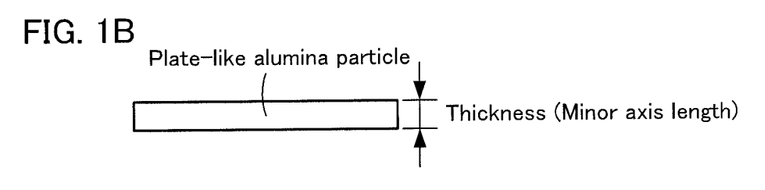
FIG. 1B is a front view of the plate-like alumina particle.

The plate-like raw-material powder layer used in Step (a) is a layer including an assembly of plate-like raw-material particles. The plate-like raw-material powder preferably has an aspect ratio of 3 or more. The term "aspect ratio" used herein refers to the ratio of average particle diameter/average thickness. The term "average particle diameter" used herein refers to the average length of the longer axes of the surfaces of particles. The term "average thickness" used herein refers to the average length of the shorter axes of the particles. The above averages are determined by observing 100 particles randomly sampled from the plate-like raw-material powder with a scanning electron microscope (SEM). FIGS. 1A and 1B include schematic diagrams illustrating a plate-like alumina particle that is an example of the plate-like raw-material particle, where FIGS. 1A and 1B are a plan view and a front view of the plate-like alumina particle, respectively. The plate-like alumina particle has a substantially hexagonal shape when viewed in plan. The particle diameter and thickness of the plate-like alumina particle are as illustrated in FIGS. 1A and 1B, respectively. The average particle diameter of the plate-like raw-material powder is preferably large in order to increase the degree of orientation of the oriented sintered body. Specifically, the average particle diameter of the plate-like raw-material powder is preferably 1.5 µm or more, is more preferably 5 µm or more, is further preferably 10 µm or more, and is particularly preferably 15 µm or more. However, the average particle diameter of the plate-like raw-material powder is preferably small from the viewpoint of densification. Specifically, the average particle diameter of the plate-like raw-material powder is preferably 30 µm or less. For the above reasons, in order to achieve both high orientation and densification, the average particle diameter of the plate-like raw-material powder is preferably 1.5 to 30 µm. The plate-like raw-material powder layer may be a layer including only the plate-like raw-material powder or may be a layer including a mixture of the plate-like raw-material powder with an additive. Examples of the additive include a sintering aid, graphite, a binder, a plasticizer, a dispersant, and a disperse medium. In the plate-like raw-material powder layer, the plate-like raw-material particles, which constitute the plate-like raw-material powder, are arranged such that the surfaces thereof extend along the surface of the fine raw-material powder layer. The plate-like raw-material powder is preferably constituted by single particles. If the plate-like raw-material powder is not constituted by single particles, the degree of orientation and tilt angle may become degraded. The single particles can be prepared by using at least one treatment selected from classification, disintegration, and elutriation; it is preferable to use all the above treatments. It is preferable to use classification and disintegration when, for example, coagulation of the particles is present. Examples of the classification treatment include air classification. Examples of the disintegration treatment include pot disintegration and wet atomization. It is preferable to use elutriation when microparticles are mixed in the particles.

The multilayer body prepared in Step (a) is a multilayer body that includes the fine raw-material powder layers and the plate-like raw-material powder layers alternately stacked one another. In the preparation of the multilayer body, a single-side processed body may be prepared by entirely or partially covering one of the surfaces of a compact of the fine raw-material powder with the plate-like raw-material powder layer, and the multilayer body may be prepared using the single-side processed body. Alternatively, a double-side processed body may be prepared by entirely or partially covering both of the surfaces of a compact of the fine raw-material powder with the plate-like raw-material powder layer, and the multilayer body may be prepared using the double-side processed body and the compacts that have not been processed.

The single-side processed body and the double-side processed body may be prepared by stacking a compact of the plate-like raw-material powder having a smaller thickness than the compact of the fine raw-material powder on one or both of the surfaces of the compact of the fine raw-material powder. In such a case, the compact of the plate-like raw-material powder may be formed by applying a shearing force to the plate-like raw-material particles by tape casting method, printing method, or the like such that the surfaces of the plate-like raw-material particles extend along the surface of the compact. Alternatively, the single-side processed body and the double-side processed body may be prepared by applying a dispersion liquid containing the plate-like raw-material powder on one or both of the surfaces of the compact of the fine raw-material powder by printing method, spray coating method, spin coating method, or dip coating method. It is possible to arrange the plate-like raw-material particles by spray coating method, spin coating method, or dip coating method such that the surfaces of the plate-like raw-material particles extend along the surface of the compact even without the forcible application of the shearing force. Although some of the plate-like raw-material particles arranged on the surface of the compact may overlap one another, it is preferable that the plate-like raw-material particles arranged on the surface of the compact do not overlap one another. Screen printing method is suitably used for printing method. In such a case, either a mesh mask or a metal mask may be used. It is preferable to use a mesh mask when printing method is performed on a thin film. In the case where a mesh mask is used, the wire diameter of the mesh mask is preferably small in order to arrange the particles such that the particles do not overlap one another. The size of openings of the mesh mask is preferably 50 µm or less.

In the case where the single-side processed body is used, the single-side processed bodies are stacked one another such that the fine raw-material powder layers and the plate-like raw-material powder layers are alternately stacked one another. In the case where the double-side processed body is used, the double-side processed bodies and unprocessed compacts of the fine raw-material powder are alternately stacked one another. In another case, both the single-side processed body and the double-side processed body may be used for preparing the multilayer body. Alternatively, the single-side processed body, the double-side processed body, and the unprocessed compact may be used for preparing the multilayer body.

Figure 2A:
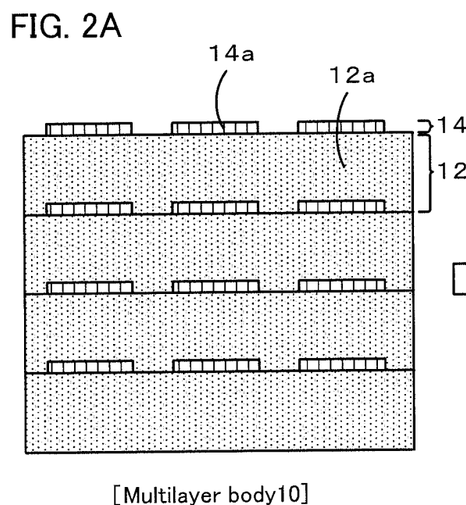
FIG. 2A is a cross-sectional view of a multilayer body 10.
Figure 2B:
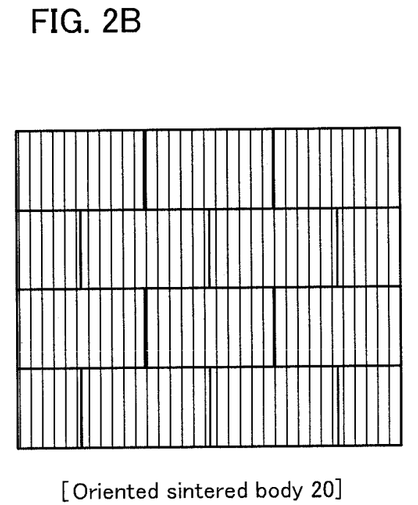
FIG. 2B is a cross-sectional view of an oriented sintered body 20.

In Step (b), the multilayer body is sintered. In this step, it is preferable to sinter the multilayer body under pressure. Examples of the method for sintering the multilayer body under pressure include hot-press sintering and HIP sintering. Prior to the sintering of the multilayer body under pressure, pre-sintering may be performed under normal pressure. In the case where HIP sintering is performed, a capsule method may be used. The pressure at which hot-press sintering is performed is preferably 50 kgf/cm$^2$ or more and is more preferably 200 kgf/cm$^2$ or more. The pressure at which HIP sintering is performed is preferably 1000 kgf/cm$^2$ or more and is more preferably 2000 kgf/cm$^2$ or more. The atmosphere in which sintering is performed is not limited but is preferably an air atmosphere, a nitrogen atmosphere, an inert gas atmosphere, such as an Ar atmosphere, or a vacuum atmosphere. A nitrogen atmosphere and an Ar atmosphere are particularly preferable. A nitrogen atmosphere is most preferable. FIGS. 2A and 2B include schematic diagrams illustrating the process for preparing the oriented sintered body in which the production method according to the present invention is used. As illustrated in FIG. 2A, a multilayer body 10 includes fine raw-material powder layers 12 that are layers including an assembly of fine raw-material particles 12a and plate-like raw-material powder layers 14 that include plate-like raw-material particles 14a arranged such that the surfaces of the plate-like raw-material particles 14a extend along the surfaces of the fine raw-material powder layers 12. The fine raw-material powder layers 12 and the plate-like raw-material powder layers 14 are alternately stacked one another. When the multilayer body 10 is sintered, the plate-like raw-material particles 14a serve as seed crystals (i.e., templates), the fine raw-material particles 12a serve as matrices, and homoepitaxial growth is performed while the matrices are incorporated into the templates. Consequently, an oriented sintered body 20 having a high degree of orientation and a small tilt angle is formed as illustrated in FIG. 2B. The degree of orientation and the tilt angle of the oriented sintered body 20 vary with the coverage at which the plate-like raw-material powder covers the surfaces of the fine raw-material powder layers. When the above coverage is 1% to 60% (preferably 1% to 20% and further preferably 3% to 20%), the oriented sintered body 20 has a high degree of orientation and a small tilt angle. The degree of orientation and the tilt angle of the oriented sintered body 20 vary also with the thickness of the fine raw-material powder layers. When the thickness of the fine raw-material powder layers is 5 to 100 μm (preferably 10 to 100 μm and more preferably 20 to 60 μm), the oriented sintered body 20 has a high degree of orientation and a small tilt angle. The term "degree of orientation" used herein refers to the degree of c-plane orientation determined using an X-ray diffraction profile by the Lotgering method. The term "tilt angle" used herein refers to XRC half-width (XRC-FWHM).

Examples of the principal component of the fine raw-material powder and the plate-like raw-material powder include alumina, lead zirconate titanate (PZT), ZnO, $BaTiO_3$, and $(K,Na)NbO_3$. Among the above substances, alumina is preferable because the advantageous effects of the present invention are markedly enhanced when the principal component is alumina. In the case where the principal component is alumina, the sintering temperature (i.e., the maximum achieving temperature) is preferably 1850° C. to 2050° C. and is more preferably 1900° C. to 2000° C. The term "principal component" used herein refers to a component of a powder the amount of which is 50% (preferably 60%, more preferably 70%, and further preferably 80%) by mass or more of the total amount of the powder.

Figure 3:
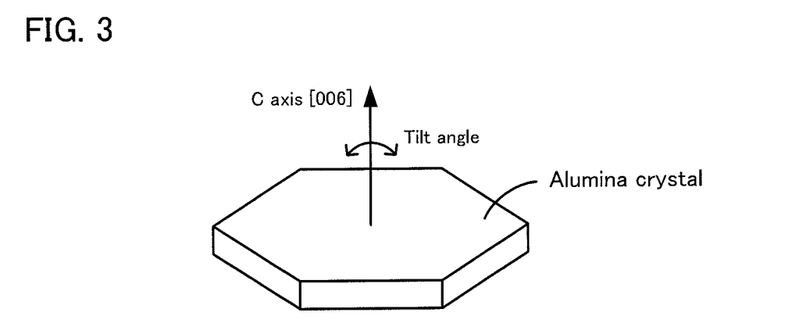
FIG. 3 is a diagram illustrating tilt angle.

The oriented sintered body produced by the production method according to the present invention has a high degree of c-plane orientation and a small tilt angle. For example, it is possible to produce an oriented sintered body having a degree of c-plane orientation of 80% or more (preferably 90% or more and more preferably 96% or more) as determined using an X-ray diffraction profile by the Lotgering method. In terms of tilt angle, it is possible to produce an oriented sintered body having an XRC-FWHM of 5° or less (preferably 2.5° or less and more preferably 1.5° or less) as determined by X-ray rocking curve analysis. FIG. 3 is a schematic diagram illustrating the tilt angle of an alumina crystal.

The oriented sintered body produced by the above-described method can be used for producing an optical element, a ground substrate for optical elements, a substrate for epitaxial growth, an electrostatic chuck, or the like. Examples of the optical element and the ground substrate for optical elements include an LED, an LD, a solar cell, a sensor, a photodiode, an optical member, and a window material.

EXAMPLES

Experimental Example 1

1. Preparation of Alumina Sintered Body
(1) Preparation of Multilayer Body

With 100 parts by mass of a fine alumina powder (TM-DAR (average particle diameter: 0.1 μm), produced by TAIMEI CHEMICALS CO., LTD.), 0.0125 parts by mass (i.e., 125 ppm by mass) of magnesium oxide (500A, produced by Ube Material Industries, Ltd.), 7.8 parts by mass of polyvinyl butyral (item number: BM-2, produced by SEKISUI CHEMICAL CO., LTD.) used as a binder, 3.9 parts by mass of di(2-ethylhexyl) phthalate (produced by Kurogane Kasei Co., Ltd.) used as a plasticizer, 2 parts by mass of sorbitan trioleate (RHEODOL SP-O30, produced by Kao Corporation) used as a dispersant, and 2-ethylhexanol used as a disperse medium were mixed. The amount of the disperse medium used was adjusted such that the resulting slurry had a viscosity of 20000 cP. The slurry prepared in the above manner was applied to a PET film by doctor blade method in a sheet-like shape such that the resulting layer had a thickness of 40 μm after dried. Hereby, a fine alumina powder layer was prepared.

With 100 parts by mass of a plate-like alumina powder (YFA10030 (average particle diameter: 10 μm, average thickness: 0.3 μm, aspect ratio: 33), produced by KINSEI MATEC CO., LTD.), 50 parts by mass of polyvinyl butyral (item number: BM-2, produced by SEKISUI CHEMICAL CO., LTD.) used as a binder, 25 parts by mass of di(2-ethylhexyl) phthalate (produced by Kurogane Kasei Co., Ltd.) used as a plasticizer, 2 parts by mass of sorbitan trioleate (RHEODOL SP-O30, produced by Kao Corporation) used as a dispersant, and a mixed solution of xylene and 1-butanol (mixing ratio=1:1) used as a disperse medium were mixed. The amount of the disperse medium used was adjusted such that the resulting slurry had a viscosity of 5000 cP. The slurry prepared in the above manner was applied to a PET film by reverse doctor blade method in a sheet-like shape such that the resulting layer had a thickness of 3 μm after dried. Hereby, a plate-like alumina powder layer was prepared.

The fine alumina powder layer and the plate-like alumina powder layer were detached from the PET films, and 50 fine alumina powder layers and 50 plate-like alumina powder layers were alternately stacked one another. Subsequently, the stacked layers were placed on an Al plate having a thickness of 10 mm and then charged into a package. The inside of the package was vacuumed in order to perform vacuum packaging. The vacuum package was subjected to isostatic pressing in hot water of 85° C. at a pressure of 100 $kgf/cm^2$. Hereby, a multilayer body was prepared. The coverage at which the surfaces of the fine alumina powder layers were covered with the plate-like alumina powder layers was 60%. The above coverage was determined in the following manner. Specifically, the surface of the fine alumina powder layer was observed with an optical microscope, and the image captured in the observation was divided into a portion including the plate-like alumina powder and the other portion by image processing. The proportion of the area of the plate-like alumina powder to the area of the surface of the fine alumina powder layer in the image was considered to be the coverage.

(2) Sintering of Multilayer Body

The multilayer body was placed in a degreasing furnace and degreased at 600° C. for 10 hours. The degreased body was sintered by hot pressing with a graphite mold in a nitrogen atmosphere at a sintering temperature (i.e., a maximum achieving temperature) of 1975° C. for 4 hours at a contact pressure of 200 kgf/cm². Hereby, an alumina sintered body was prepared. Note that, while the temperature was reduced from the sintering temperature, the pressure was maintained until the temperature reached 1200° C. and subsequently released to zero in the temperature range of less than 1200° C.

2. Properties of Alumina Sintered Body (1) Degree of c-Plane Orientation

In order to determine the degree of orientation of the alumina sintered body, the alumina sintered body was ground such that the ground surface was parallel to the top surface of the alumina sintered body. The ground surface was irradiated with an X-ray in order to measure the degree of c-plane orientation. An XRD profile was measured with an XRD system (produced by Rigaku Corporation, RINT-TTR III) in the range of 2θ=20° to 70°. Specifically, the measurement was conducted using CuKα radiation at a voltage of 50 kV and a current of 300 mA. The degree of c-plane orientation was calculated by the Lotgering method. Specifically, the following formula was used for the calculation. In the formula below, P is a value determined by the XRD analysis of the alumina sintered body, and $P_0$ is a value determined from standard α-alumina (JCPDS Card No. 46-1212). The degree of c-plane orientation of the alumina sintered body prepared in Experimental Example 1 was 100%.

$$\text{Degree of c-plane orientation [\%]} = \frac{p - p_0}{1 - p_0} \times 100 \quad [\text{Math. 1}]$$

$$p_0 = \frac{I_0(006)}{\sum I_0(hkl)}$$

$$p = \frac{I_s(006)}{\sum I_s(hkl)}$$

(2) Tilt Angle

Figure 4:
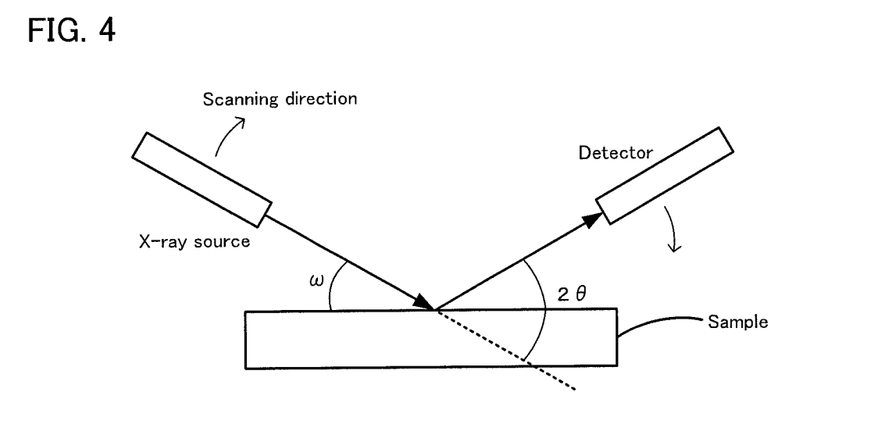
FIG. 4 is a diagram illustrating the rocking curve analysis.

Tilt angle represents the distribution of inclination of crystallographic axis and was used as a parameter for evaluating the frequency at which the crystallographic orientation of alumina was inclined with respect to the c-axis. In Examples, tilt angle is represented by X-ray rocking curve (XRC) half-width (FWHM). XRC-FWHM was determined by scanning the surface (same as the surface used for measuring the degree of c-plane orientation) of the alumina sintered body with an X-ray source and a detector that were operated in an interlocked manner as illustrated in FIG. 4 and measuring the half-width of the resulting curve. The measurement method in which the angle 2θ (i.e., the angle formed by the detector and the incident X-ray) is fixed at the diffraction peak position and scanning is performed while only the angle ω (i.e., the angle formed by the surface of the sample substrate and the incident X-ray) is changed in the above manner is referred to as "rocking curve analysis". The system used was RINT-TTR III produced by Rigaku Corporation. The measurement was conducted using CuKα radiation at a voltage of 50 kV and a current of 300 mA. The scanning range ω was set to 3.8° to 38.8°. The XRC-FWHM of the alumina sintered body prepared in Experimental Example 1 was 2.2°.

TABLE 1

| | Multilayer body | | | | | | | Sintering body | |
| | Fine raw-material powder layer | | | Plate-like raw-material powder layer | | | | | Degree of | |
| Experimental Example | Fine raw-material powder[X-1] | Producing Method | Thickness [μm] | Plate-like raw-material powder[X-2] | Producing Method | Thickness [μm] | Coverage [%] | Number of layers | Sintering Method | c-plane orientation [%] | XRC · FWHM [°] |
|---|---|---|---|---|---|---|---|---|---|---|---|
| 1 | a | Tape casting | 40 | c | Tape casting | 3 | 60 | Each layer 50 | Hot pressing | 100 | 2.2 |
| 2 | b | Tape casting | 40 | c | Tape casting | 3 | 60 | Each layer 50 | Hot pressing | 100 | 2.3 |
| 3 | b | Tape casting | 100 | c | Tape casting | 3 | 60 | Each layer 50 | Hot pressing | 100 | 2.4 |
| 4 | a | Tape casting | 40 | c | Screen printing | 20 | 40 | Each layer 50 | Hot pressing | 100 | 2.2 |
| 5 | b | Tape casting | 40 | c | Screen printing | 20 | 40 | Each layer 50 | Hot pressing | 100 | 2.2 |
| 6 | a | Tape casting | 40 | c | Screen printing | 1 | 3 | Each layer 50 | Hot pressing | 100 | 1.0 |
| 7 | a | Tape casting | 40 | d | Screen printing | 1 | 3 | Each layer 50 | Hot pressing | 100 | 0.8 |
| 8 | b | Tape casting | 40 | d | Screen printing | 1 | 3 | Each layer 50 | Hot pressing | 100 | 1.0 |
| 9 | a | Tape casting | 80 | d | Screen printing | 1 | 7 | Each layer 50 | Hot pressing | 100 | 1.0 |
| 10 | b | Tape casting | 80 | d | Screen printing | 1 | 7 | Each layer 50 | Hot pressing | 100 | 1.0 |
| 11 | a | Tape casting | 40 | c | Spray coating | — | 1 | Each layer 50 | Hot pressing | 100 | 1.2 |
| 12 | b | Tape casting | 40 | c | Spray coating | — | 2 | Each layer 50 | Hot pressing | 100 | 1.3 |
| 13 | a | Tape casting | 40 | d | Spray coating | — | 1 | Each layer 50 | Hot pressing | 100 | 0.9 |
| 14 | a | Tape casting | 40 | e | Spray coating | — | 1 | Each layer 50 | Hot pressing | 100 | 0.9 |
| 15 | a | Tape casting | 40 | d | Spray coating | — | 9 | Each layer 50 | Hot pressing | 100 | 1.2 |

TABLE 1-continued

| | Multilayer body | | | | | | | | Sintering body | |
|---|---|---|---|---|---|---|---|---|---|---|
| | Fine raw-material powder layer | | | Plate-like raw-material powder layer | | | | | Degree of | |
| Experimental Example | Fine raw-material powder[X1] | Producing Method | Thickness [μm] | Plate-like raw-material powder[X2] | Producing Method | Thickness [μm] | Coverage [%] | Number of layers | Sintering Method | c-plane orientation [%] | XRC · FWHM [°] |
|---|---|---|---|---|---|---|---|---|---|---|---|
| 16 | a | Tape casting | 40 | d | Spray coating | — | 5 | Each layer 50 | Hot pressing | 100 | 1.3 |
| 17 | b | Tape casting | 40 | d | Spray coating | — | 5 | Each layer 50 | Hot pressing | 100 | 1.3 |
| 18 | a | Tape casting | 40 | c | Spin coating | — | 10 | Each layer 50 | Hot pressing | 100 | 1.2 |
| 19 | a | Tape casting | 10 | c | Spin coating | — | 10 | Each layer 50 | Hot pressing | 100 | 1.2 |
| 20 | a | Tape casting | 40 | c | Spin coating | — | 3 | Each layer 50 | Hot pressing | 100 | 1.1 |
| 21 | b | Tape casting | 40 | c | Spin coating | — | 12 | Each layer 50 | Hot pressing | 100 | 1.3 |
| 22 | a | Tape casting | 40 | c | Dip coating | — | 15 | Each layer 50 | Hot pressing | 100 | 1.2 |
| 23 | a | Tape casting | 40 | c | Dip coating | — | 2 | Each layer 50 | Hot pressing | 99 | 1.2 |
| 24 | b | Tape casting | 40 | c | Dip coating | — | 15 | Each layer 50 | Hot pressing | 100 | 1.2 |

[X1]Fine raw-material powder a: TM-DAR produced by TAIMEI CHEMICALS CO., LTD. b: AKP-20 produced by Sumitomo Chemical Co., Ltd.
[X2]Plate-like raw-material powder c: YFA10030 produced by KINSEI MATEC CO., LTD. d: YFA10030 classified, performed disintegration, and removed microparticles by elutriation
e: In-house produced plate-like alumina powder Experimental Example 2

An alumina sintered body was prepared as in Experimental Example 1, except that the fine alumina powder used in the section 1.(1) of Experimental Example 1 was changed to AKP-20 (average particle diameter: 0.4 μm, produced by Sumitomo Chemical Co., Ltd.). The properties of the alumina sintered body were measured. Table 1 shows the results.

Experimental Example 3

An alumina sintered body was prepared as in Experimental Example 1, except that the fine alumina powder used in the section 1.(1) of Experimental Example 1 was changed to AKP-20 (average particle diameter: 0.4 μm, produced by Sumitomo Chemical Co., Ltd.) and the thickness of the dried fine alumina powder layer was changed to 100 μm. The properties of the alumina sintered body were measured. Table 1 shows the results.

Experimental Example 4

An alumina sintered body was prepared as in Experimental Example 1, except that, when the multilayer body described in the section 1.(1) of Experimental Example 1 was prepared, a single-side processed body was prepared by applying a print paste of plate-like alumina onto one of the surfaces of the fine alumina powder layer by screen printing method, and 50 layers of the single-side processed bodies were stacked one another to form a multilayer body. The properties of the alumina sintered body were measured. Table 1 shows the features of the multilayer body and the properties of the alumina sintered body.

In Experimental Example 4, the single-side processed body was prepared by the following method. With 100 parts by mass of a plate-like alumina powder (YFA10030, produced by KINSEI MATEC CO., LTD.), 100 parts by mass of polyvinyl butyral (item number: BLS, produced by SEKISUI CHEMICAL CO., LTD.) used as a binder and 2-ethylhexanol used as a disperse medium were mixed. The amount of disperse medium used was adjusted such that the resulting paste had a viscosity of 50000 cP. Hereby, a print paste was prepared. The print paste was applied to one of the surfaces of the fine alumina powder layer with a printing plate on which an emulsion was deposited (SX360 mesh, emulsion thickness: 5 μm) such that the resulting layer had a thickness of 20 μm after dried. Hereby, a single-side processed body was prepared.

Experimental Example 5

An alumina sintered body was prepared as in Experimental Example 4, except that the fine alumina powder used in Experimental Example 4 was changed to AKP-20 (average particle diameter: 0.4 μm, produced by Sumitomo Chemical Co., Ltd.). The properties of the alumina sintered body were measured. Table 1 shows the features of the multilayer body and the properties of the alumina sintered body.

Experimental Example 6

An alumina sintered body was prepared as in Experimental Example 4, except that the method for preparing a single-side processed body which was used in Experimental Example 4 was changed as follows. The properties of the alumina sintered body were measured. Table 1 shows the features of the multilayer body and the properties of the alumina sintered body.

In Experimental Example 6, the single-side processed body was prepared by the following method. With 100 parts by mass of a plate-like alumina powder (YFA10030, produced by KINSEI MATEC CO., LTD.), 100 parts by mass of polyvinyl butyral (item number: BLS, produced by SEKISUI CHEMICAL CO., LTD.) used as a binder and 3500 parts by mass of terpineol used as a dispersant were mixed. Hereby, a print paste was prepared. The print paste was applied to one of the surfaces of the fine alumina powder layer with a printing plate on which an emulsion was deposited (ST640 mesh, emulsion thickness: 5 μm). Hereby, a single-side processed body was prepared. The resulting plate-like alumina powder layer had a thickness of 0.5 µm.

Experimental Example 7

An alumina sintered body was prepared as in Experimental Example 6, except that the plate-like alumina powder used in Experimental Example 6 was changed to a plate-like alumina powder prepared by classifying YFA10030 produced by KINSEI MATEC CO., LTD. with an air classifier (TC-15N produced by Nisshin Engineering Inc.) at a cut-point of 3 µm, subsequently performing disintegration with a pot disintegrator using pebble stones having a diameter of 0.3 mm for 20 hours, and finally removing microparticles by elutriation. The properties of the alumina sintered body were measured. Table 1 shows the features of the multilayer body and the properties of the alumina sintered body.

Experimental Example 8

An alumina sintered body was prepared as in Experimental Example 7, except that the fine alumina powder used in Experimental Example 7 was changed to AKP-20 (average particle diameter: 0.4 µm, produced by Sumitomo Chemical Co., Ltd.). The properties of the alumina sintered body were measured. Table 1 shows the features of the multilayer body and the properties of the alumina sintered body.

Experimental Example 9

An alumina sintered body was prepared as in Experimental Example 4, except that the thickness of the fine alumina powder layer prepared in Experimental Example 4 was changed to 80 µm and the method for preparing a single-side processed body used in Experimental Example 4 was changed as follows. The properties of the alumina sintered body were measured. Table 1 shows the features of the multilayer body and the properties of the alumina sintered body.

In Experimental Example 9, the single-side processed body was prepared by the following method. A plate-like alumina powder was prepared by classifying YFA10030 produced by KINSEI MATEC CO., LTD. with an air classifier (TC-15N produced by Nisshin Engineering Inc.) at a cut-point of 3 µm, subsequently performing disintegration with a pot disintegrator using pebble stones having a diameter of 0.3 mm for 20 hours, and finally removing microparticles by elutriation. With 100 parts by weight of the above plate-like alumina powder, 60 parts by mass of polyvinyl butyral (item number: BLS, produced by SEKISUI CHEMICAL CO., LTD.) used as a binder and 2000 parts by mass of terpineol used as a disperse medium were mixed. Hereby, a print paste was prepared. The print paste was applied to one of the surfaces of the fine alumina powder layer with a printing plate on which an emulsion was deposited (ST640 mesh, emulsion thickness: 5 µm). Hereby, a single-side processed body was prepared. The resulting plate-like alumina powder layer had a thickness of 1 µm.

Experimental Example 10

An alumina sintered body was prepared as in Experimental Example 9, except that the fine alumina powder used in Experimental Example 9 was changed to AKP-20 (average particle diameter: 0.4 µm, produced by Sumitomo Chemical Co., Ltd.). The properties of the alumina sintered body were measured. Table 1 shows the features of the multilayer body and the properties of the alumina sintered body.

Experimental Example 11

An alumina sintered body was prepared as in Experimental Example 1, except that, when the multilayer body described in the section 1.(1) of Experimental Example 1 was prepared, a single-side processed body was prepared by applying a slurry of plate-like alumina particles onto one of the surfaces of the fine alumina powder layer by spray coating, and 50 layers of the single-side processed bodies were stacked one another to form a multilayer body. The properties of the alumina sintered body were measured. Table 1 shows the features of the multilayer body and the properties of the alumina sintered body.

In Experimental Example 11, the single-side processed body was prepared by the following method. To 100 parts by mass of a plate-like alumina powder (YFA10030, produced by KINSEI MATEC CO., LTD.), 5000 parts by mass of isopropyl alcohol used as a disperse medium was added. The resulting dispersion liquid (i.e., a slurry of plate-like alumina particles) was dispersed for 5 minutes with an ultrasonic disperser and subsequently sprayed to the compact of the fine particles with a spray gun (Spray-Work HG Wide Airbrush produced by Tamiya, Inc.) at a spray pressure of 0.2 MPa and a spray distance of 20 cm such that a coverage of 1% was achieved. Hereby, a single-side processed body was prepared.

Experimental Example 12

An alumina sintered body was prepared as in Experimental Example 11, except that the fine alumina powder used in Experimental Example 11 was changed to AKP-20 (average particle diameter: 0.4 µm, produced by Sumitomo Chemical Co., Ltd.). The properties of the alumina sintered body were measured. Table 1 shows the features of the multilayer body and the properties of the alumina sintered body.

Experimental Example 13

An alumina sintered body was prepared as in Experimental Example 11, except that the plate-like alumina powder used in Experimental Example 11 was changed to a plate-like alumina powder prepared by classifying YFA10030 produced by KINSEI MATEC CO., LTD. with an air classifier (TC-15N produced by Nisshin Engineering Inc.) at a cut-point of 3 µm, subsequently performing disintegration with a pot disintegrator using pebble stones having a diameter of 0.3 mm for 20 hours, and finally removing microparticles by elutriation. The properties of the alumina sintered body were measured. Table 1 shows the features of the multilayer body and the properties of the alumina sintered body.

Experimental Example 14

An alumina sintered body was prepared as in Experimental Example 11, except that the plate-like alumina powder used in Experimental Example 11 was changed to an in-house produced plate-like alumina powder. The properties of the alumina sintered body were measured. Table 1 shows the features of the multilayer body and the properties of the alumina sintered body.

The in-house produced plate-like alumina powder was prepared by the following method. Specifically, 96 parts by mass of high-purity γ-alumina (TM-300D, produced by TAIMEI CHEMICALS CO., LTD.), 4 parts by mass of high-purity $AlF_3$ (produced by KANTO CHEMICAL CO., INC., Cica Special Grade), 0.17 parts by mass of high-purity α-alumina (TM-DAR, produced by TAIMEI CHEMICALS CO., LTD., D50=1 μm) used as a seed crystal, and IPA (isopropyl alcohol) used as a solvent were mixed with one another in a pot mill for 5 hours with alumina balls having a diameter of 2 mm. The proportion of the total amount of impurity elements other than F, H, C, or S in the resulting mixed powder was 1000 ppm by mass or less. Into a sheath (volume: 750 $cm^3$) made of high-purity alumina having a purity of 99.5% by mass, 300 g of the above mixed raw-material powder was charged. After a lid made of high-purity alumina having a purity of 99.5% by mass had been put on the sheath, a heat treatment was performed in an electric furnace at 900° C. for 3 hours in a stream of air. The flow rate of air was 25000 cc/min. The powder that had been subjected to the above heat treatment was annealed at 1150° C. for 40 hours in air. The annealed powder was disintegrated for 4 hours with alumina balls having a diameter of 2 mm. Hereby, a plate-like alumina powder having an average particle diameter of 2 μm, an average thickness of 0.2 μm, and an aspect ratio of 10 was prepared. The average particle diameter and average thickness of the particles were determined by observing 100 particles randomly sampled from the plate-like alumina powder with a scanning electron microscope (SEM). The term "average particle diameter" used herein refers to the average length of the longer axes of the particles. The term "average thickness" used herein refers to the average length of the shorter axes of the particles. The term "aspect ratio" used herein refers to the ratio of average particle diameter/average thickness. The plate-like alumina powder prepared above was α-alumina.

Experimental Example 15

An alumina sintered body was prepared as in Experimental Example 13, except that the amount of the disperse medium used in Experimental Example 13 was changed to 1000 parts by mass relative to 100 parts by mass of the plate-like alumina powder. The properties of the alumina sintered body were measured. Table 1 shows the features of the multilayer body and the properties of the alumina sintered body.

Experimental Example 16

An alumina sintered body was prepared as in Experimental Example 15, except that the single-side processed body described in Experimental Example 15 was prepared by spraying the slurry on the fine alumina powder layer with a spray gun (Spray-Work HG Wide Airbrush produced by Tamiya, Inc.) at a spray pressure of 0.2 MPa and a spray distance of 20 cm such that a coverage of 5% was achieved. The properties of the alumina sintered body were measured. Table 1 shows the features of the multilayer body and the properties of the alumina sintered body.

Experimental Example 17

An alumina sintered body was prepared as in Experimental Example 16, except that the fine alumina powder used in Experimental Example 16 was changed to AKP-20 (average particle diameter: 0.4 μm, produced by Sumitomo Chemical Co., Ltd.). The properties of the alumina sintered body were measured. Table 1 shows the features of the multilayer body and the properties of the alumina sintered body.

Experimental Example 18

An alumina sintered body was prepared as in Experimental Example 1, except that, when the multilayer body described in the section 1.(1) of Experimental Example 1 was prepared, a single-side processed body was prepared by applying a slurry of plate-like alumina particles onto one of the surfaces of the fine alumina powder layer by spin coating and 50 layers of the single-side processed bodies were stacked one another to form a multilayer body. The properties of the alumina sintered body were measured. Table 1 shows the features of the multilayer body and the properties of the alumina sintered body.

In Experimental Example 18, the single-side processed body was prepared by the following method. To 100 parts by mass of a plate-like alumina powder (YFA10030, produced by KINSEI MATEC CO., LTD.), 1000 parts by mass of isopropyl alcohol used as a disperse medium was added. The resulting dispersion liquid (i.e., a slurry of plate-like alumina particles) was dispersed for 5 minutes with an ultrasonic disperser and subsequently applied to the compact of the fine particles with a spin coater. Hereby, a single-side processed body was prepared. The application of the slurry was performed at a rotational speed of 2000 rpm. The amount of slurry used was 3 parts by mass.

Experimental Example 19

An alumina sintered body was prepared as in Experimental Example 18, except that the thickness of the dried fine alumina powder layer prepared in Experimental Example 18 was changed to 10 μm. The properties of the alumina sintered body were measured. Table 1 shows the features of the multilayer body and the properties of the alumina sintered body.

Experimental Example 20

An alumina sintered body was prepared as in Experimental Example 18, except that the amount of isopropyl alcohol used as a disperse medium in the preparation of the single-side processed body described in Experimental Example 18 was changed to 3000 parts by mass relative to 100 parts by mass of the plate-like alumina powder (YFA10030, produced by KINSEI MATEC CO., LTD.). The properties of the alumina sintered body were measured. Table 1 shows the features of the multilayer body and the properties of the alumina sintered body.

Experimental Example 21

An alumina sintered body was prepared as in Experimental Example 18, except that the fine alumina powder used in Experimental Example 18 was changed to AKP-20 (average particle diameter: 0.4 μm, produced by Sumitomo Chemical Co., Ltd.). The properties of the alumina sintered body were measured. Table 1 shows the features of the multilayer body and the properties of the alumina sintered body.

Experimental Example 22

An alumina sintered body was prepared as in Experimental Example 1, except that, when the multilayer body described in the section 1.(1) of Experimental Example 1 was prepared, a double-side processed body was prepared by applying a slurry of plate-like alumina particles onto both of the surfaces of the fine alumina powder layer by dip coating method, and 50 layers of the double-side processed bodies and 50 layers of unprocessed fine alumina powder layers were alternately stacked one another to form a multilayer body. The properties of the alumina sintered body were measured. Table 1 shows the features of the multilayer body and the properties of the alumina sintered body.

In Experimental Example 22, the double-side processed body was prepared by the following method. To 100 parts by mass of a plate-like alumina powder (YFA10030, produced by KINSEI MATEC CO., LTD.), 700 parts by mass of isopropyl alcohol used as a disperse medium was added. The resulting liquid mixture was dispersed for five minutes with an ultrasonic disperser. The compact of the fine particles was dipped into the liquid with a dip coater and subsequently withdrawn from the liquid at a withdrawal speed of 4 mm/min. Hereby, a double-side processed body that included a fine alumina powder layer and plate-like alumina powder layers disposed on the respective surfaces of the fine alumina powder layer was prepared.

Experimental Example 23

An alumina sintered body was prepared as in Experimental Example 22, except that the withdrawal speed described in Experimental Example 22 was changed to 10 mm/min. The properties of the alumina sintered body were measured. Table 1 shows the features of the multilayer body and the properties of the alumina sintered body.

Experimental Example 24

An alumina sintered body was prepared as in Experimental Example 13, except that the fine alumina powder used in Experimental Example 22 was changed to AKP-20 (average particle diameter: 0.4 µm, produced by Sumitomo Chemical Co., Ltd.). The properties of the alumina sintered body were measured. Table 1 shows the features of the multilayer body and the properties of the alumina sintered body.

An explanation for the thickness of the plate-like alumina powder layer in Table 1 is given below. In the case where the plate-like alumina powder layer was prepared by tape casting method or screen printing method, not only the plate-like alumina powder but also the other components remained after drying to form a uniform layer as a whole and, therefore, it was possible to measure the thickness of the plate-like alumina powder layer. In contrast, in the case where the plate-like alumina powder layer was prepared by spray coating method, spin coating method, or dip coating method, only the plate-like alumina powder remained in a scattered manner after drying and did not form a uniform layer as a whole and, therefore, it was not possible to measure the thickness of the plate-like alumina powder layer. Thus, the symbol "-", which means "unmeasurable", is shown in the boxes of "Thickness" of such plate-like alumina powder layers.

[Evaluations]

In Experimental Examples 1 to 24, a highly oriented sintered body having a degree of c-plane orientation of 100% and an XRC-FWHM of 2.5° or less was prepared. In Experimental Examples 11 to 24 where the plate-like alumina powder layer was prepared by spray coating method, spin coating method, or dip coating method, the XRC-FWHM of the oriented sintered body was 1.5° or less, that is, a sintered body having a further high degree of orienta-tion was prepared. The reasons for this are not clear but presumably that, in the case where the application of the plate-like alumina particles is performed by spray coating method, spin coating method, or dip coating method, the likelihood of the plate-like alumina particles overlapping one another is small and the likelihood of the plate-like alumina particles being arranged to extend along the compact of the fine alumina powder is large compared with the case where the application of the plate-like alumina particles is performed by tape casting method or screen printing method. In particular, in the case where a plate-like alumina powder that had been subjected to a treatment such as classification was used (Experimental Example 8) and the case where the in-house produced plate-like alumina powder was used (Experimental Example 9), the XRC-FWHM of the sintered body was 1.0° or less, that is, a sintered body having the highest degree of orientation was prepared. In Experimental Examples 5 to 10 where screen printing method was used, the XRC-FWHM of the sintered body was 1.5° or less, that is, a sintered body having a further high degree of orientation was prepared, when the thickness of the plate-like alumina powder layer was small. The reasons for this are also not clear and presumably that, as described above, the likelihood of the plate-like alumina particles overlapping one another was small and the likelihood of the plate-like alumina particles being arranged to extend along the compact of the fine alumina powder was large.

In Experimental Examples 1 to 24, the plate-like alumina powder was directly arranged in the specific manner instead of arranging plate-like alumina particles included in a mixed powder of the fine alumina powder and the plate-like alumina powder as in TGG. This eliminated the need for the large shearing force required by TGG. Therefore, it was possible to make the apparatus structure compact compared with TGG. Accordingly, it was possible to produce an oriented sintered body in an easy and simple manner compared with TGG.

Experimental Examples 1 to 24 above correspond to Examples of the present invention. It is needless to say that the present invention is not limited by Examples above. Various aspects of the present invention may be implemented within the technical scope of the present invention.

The present application is based on and claims the benefit of priority to Japanese Patent Application No. 2016-139508 filed on Jul. 14, 2016 and Japanese Patent Application No. 2015-224164 filed on Nov. 16, 2015, the entire contents of which are incorporated herein by reference.

What is claimed is:

1. A method for producing an oriented sintered body comprising the steps of:
   (a) preparing a multilayer body, the multilayer body including a layer including a fine raw-material powder and a layer including a plate-like raw-material powder which are alternately stacked on each other, particles of the plate-like raw-material powder being arranged such that surfaces of the particles of the plate-like raw-material powder extend along a surface of the layer including the fine raw-material powder; and
   (b) sintering the multilayer body,
   wherein the particles of the fine raw-material powder have a smaller average diameter than the particles of the plate-like raw-material powder, and
   wherein a coverage at which the surface of the layer including the fine raw-material powder is covered with the plate-like raw-material powder is 1% to 60%.

2. The method for producing an oriented sintered body according to claim 1, wherein the layer including the fine raw-material powder has a thickness of 5 to 100 µm.

3. The method for producing an oriented sintered body according to claim 1, wherein, in the step (a), a single-side processed body including a compact of the fine raw-material powder having two opposed major surfaces and the layer including the plate-like raw-material powder, the layer covering one major surface of the compact, is prepared, and the multilayer body is prepared using the single-side processed body.

4. The method for producing an oriented sintered body according to claim 3, wherein the single-side processed body is prepared by stacking a compact of the plate-like raw-material powder on one of the major surfaces of the compact of the fine raw-material powder, the compact of the plate-like raw-material powder having a smaller thickness than the compact of the fine raw-material powder, or by applying a dispersion liquid containing the plate-like raw-material powder on one of the major surfaces of the compact of the fine raw-material powder by printing method, spray coating method, spin coating method, or dip coating method.

5. The method for producing an oriented sintered body according to claim 1, wherein, in the step (a), a double-side processed body including a compact of the fine raw-material powder and the particles of the plate-like raw-material powder having two opposed major surfaces, the particles being arranged on both of the major surfaces of the compact such that the surfaces of the particles extend along a corresponding major surface of the compact, is prepared, and the multilayer body is prepared using the double-side processed body and a compact that has not been processed.

6. The method for producing an oriented sintered body according to claim 5, wherein the double-side processed body is prepared by stacking a compact of the plate-like raw-material powder on both of the major surfaces of the compact of the fine raw-material powder, the compact of the plate-like raw-material powder having a smaller thickness than the compact of the fine raw-material powder, or by applying a dispersion liquid containing the plate-like raw-material powder on both of the major surfaces of the compact of the fine raw-material powder by printing method, spray coating method, spin coating method, or dip coating method.

7. The method for producing an oriented sintered body according to claim 1, wherein, in the step (b), the multilayer body is sintered under pressure.

8. The method for producing an oriented sintered body according to claim 1, wherein a principal component of the fine raw-material powder and a principal component of the plate-like raw-material powder are both alumina.

* * * * *